(12) United States Patent
Ueno et al.

(10) Patent No.: US 8,933,615 B2
(45) Date of Patent: Jan. 13, 2015

(54) TUNING FORK PIEZOELECTRIC VIBRATOR WITH CLEARANCE GROOVE FORMED ON THE BASE SIDE OF THE PACKAGE

(75) Inventors: Shunsuke Ueno, Saitama (JP); Shingo Kawanishi, Saitama (JP); Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 367 days.

(21) Appl. No.: 13/419,702

(22) Filed: Mar. 14, 2012

(65) Prior Publication Data
US 2012/0293048 A1 Nov. 22, 2012

(30) Foreign Application Priority Data

Mar. 30, 2011 (JP) ................................. 2011-076543
Mar. 6, 2012 (JP) ................................. 2012-048720

(51) Int. Cl.
*H03H 9/21* (2006.01)
*H03H 9/10* (2006.01)

(52) U.S. Cl.
CPC ............... *H03H 9/1021* (2013.01); *H03H 9/21* (2013.01)
USPC ........................................ 310/370; 310/344

(58) Field of Classification Search
CPC .. H03H 9/21; H03H 2002/026; B06B 1/0659; G01C 19/56
USPC ................... 310/370, 344; 331/156; 333/200
See application file for complete search history.

(56) References Cited

U.S. PATENT DOCUMENTS 7,592,741 B2 * 9/2009 Tanaya et al. ................. 310/370
8,400,048 B2 * 3/2013 Shirai et al. ................... 310/370

FOREIGN PATENT DOCUMENTS

| JP | 2008-118501 | | 5/2008 |
| JP | 2010-141387 | | 6/2010 |
| JP | 2012039226 A | * | 2/2012 |

* cited by examiner

*Primary Examiner* — J. San Martin
(74) *Attorney, Agent, or Firm* — Edwards Wildman Palmer LLP; Scott D. Wofsy; Christopher J. Capelli

(57) ABSTRACT

A piezoelectric device including a tuning-fork piezoelectric vibrating element having a base and a pair of vibrating arms positioned parallel to each other and extending from the base at right angles. The piezoelectric device further including a pair of support arms extending from the base positioned parallel to each other and in the same direction as the vibrating arms. A package is included having a lid and a housing recess sealed by the lid wherein the tuning-fork piezoelectric vibrating element is housed. A pair of supports are provided on a bottom face of the housing recess for fixing the tuning-fork piezoelectric vibrating element by the support arms. A clearance groove is formed in the bottom face of the housing access to prevent the tuning-fork piezoelectric vibrating element from colliding against the bottom face of the housing recess.

12 Claims, 4 Drawing Sheets

TUNING FORK PIEZOELECTRIC VIBRATOR WITH CLEARANCE GROOVE FORMED ON THE BASE SIDE OF THE PACKAGE

TECHNICAL FIELD

The present invention relates to a piezoelectric device that uses the piezoelectric effect of a piezoelectric material such as crystal to generate oscillation.

BACKGROUND ART

As this type of piezoelectric device, there is known one that uses a tuning-fork piezoelectric vibrating element having a base, a pair of vibrating arms positioned parallel to each other and extending from the base at right angles as seen in a plan view, and a pair of support arms extending from the base positioned parallel to each other and in the same direction as the vibrating arms, with the pair of vibrating arms therebetween.

The piezoelectric device comprises the tuning-fork piezoelectric vibrating element and a package that hermetically houses the tuning-fork piezoelectric vibrating element therein. The package has; a lid, a housing recess sealed by the lid, and supports provided on a bottom face of the housing recess for fixing the tuning-fork piezoelectric vibrating element supported by the support arms, on opposite sides of the base.

Because the tuning-fork piezoelectric vibrating element is supported at the ends of each support arms, the support arms and the vibrating arms may bend significantly when an impact is imparted to the piezoelectric device unintentionally. Consequently, an end of the base away from a portion supported by the support arms, or ends of the vibrating arms extending from the base may collide against the bottom face of the housing recess.

Due to such a collision, a crack may occur at the ends of the support arms or the vibrating arms, and the mass of the ends decreases due to the crack, thereby significantly biasing the oscillation frequency from an intended frequency. Moreover, when damage due to the collision extends to breakage of the support arm or the vibrating arm, oscillation itself becomes impossible in the piezoelectric device. In any event, the piezoelectric device cannot be continuously used as a device for generating a reference frequency.

To avoid such a phenomenon, various kinds of efforts have been made, for example, a clearance groove (that is, a groove-like recess) is formed in a part of the bottom face of the housing recess, at a portion with which it is predicted that the end of the vibrating arm or the base collides, thereby decreasing the possibility of collision at the end (See Patent Document 1), or a damper serving as a cushion is provided at a collision portion on the bottom face so as to decrease damage as much as possible even if a collision occurs (See Patent Document 2).

PRIOR ART DOCUMENTS

[Patent Document 1] Japanese Unexamined Patent Publication No. 2008-118501
[Patent Document 2] Japanese Unexamined Patent Publication No. 2010-141387

SUMMARY OF THE INVENTION

Problems to be Solved by the Invention

The support arms of the tuning-fork piezoelectric vibrating element are for supporting the mass of the base and the mass of the vibrating arms when an impact is imparted to the piezoelectric device. At the time of a large impact imparted, the support arms bend significantly and the base enters deeply into the clearance groove. That is to say, the dynamic loading imparted on the support arms becomes biggest.

Conventionally, the clearance groove occupies a relatively large area, and an edge (rim) thereof is at a position that encroaches on an area of the support arm. Consequently, when the support arm bends significantly at the time of impact imparted, a side of the support arm collides against an angular edge of the clearance groove. The support arm is originally subjected to receive a large dynamic load and then collides with the angular edge. Hence, the support arm suffers serious damage and there is a large possibility of breakage at the contact position. Additionally, in order to improve the vibration efficiency of the tuning-fork piezoelectric vibrating element, a long through hole can be formed in the support arm along the longitudinal direction. Therefore, in this case, the support arm is even more susceptible to breakage due to impact imparted, and the problem becomes more serious.

It is an object of the present invention to prevent a portion of the support arms of the tuning-fork piezoelectric vibrating element from colliding against the angular edge of the clearance groove, when an impact is imparted to the piezoelectric device, thereby preventing breakage of the support arms.

Means for Solving the Problems

The object is achieved by the following means. That is to say, a first aspect of the claimed invention provides a piezoelectric device comprising: a tuning-fork piezoelectric vibrating element having a base, a pair of vibrating arms positioned parallel to each other and extending from the base at right angles as seen in a plan view; and a pair of support arms extending from the base positioned parallel to each other and in the same direction as the vibrating arms, with the pair of vibrating arms therebetween; and a package including a lid, a housing recess sealed by the lid and in which the tuning-fork piezoelectric vibrating element is housed, a pair of supports provided on a bottom face of the housing recess for fixing the tuning-fork piezoelectric vibrating element by the support arms, on opposite sides of the base, and a clearance groove formed in a bottom face in order to prevent the tuning-fork piezoelectric vibrating element fixed on the supports from colliding against the bottom face of the housing recess. In order to prevent a portion of the support arm from colliding against an edge of the clearance groove when an impact is imparted to the piezoelectric device, the edge of the clearance groove is formed below the base so that a portion of the base collides therewith.

A second aspect of the claimed invention provides a piezoelectric device according to the piezoelectric device of the first aspect of the invention, wherein a material of the tuning-fork piezoelectric vibrating element is crystal.

A third aspect of the claimed invention provides a piezoelectric device according to the piezoelectric device of the first or the second aspect of the invention, wherein the clearance groove has a rectangular shape as seen in a plan view.

A fourth aspect of the claimed invention provides a piezoelectric device according to the piezoelectric device of any one of the first to the third aspects of the invention, wherein electrodes respectively connected to a pair of terminal electrodes formed on a bottom face of the piezoelectric device are formed on each upper surface of the supports, and the tuning-fork piezoelectric vibrating element is mechanically supported thereon by a conductive adhesive, and a drive voltage for electrically driving the tuning-fork piezoelectric vibrating element is supplied thereto.

A fifth aspect of the claimed invention provides a piezoelectric device according to the piezoelectric device of any one of the first to the third aspects of the invention, wherein a long through hole is formed in the support arm along a longitudinal direction of the support arm.

A sixth aspect of the claimed invention provides a piezoelectric device according to the piezoelectric device of the first aspect of the invention, wherein the clearance groove is formed so as to be positioned in an area below the base and also in an area below tip ends of the pair of vibrating arms.

A seventh aspect of the claimed invention provides a piezoelectric device according to the piezoelectric device of the sixth aspect of the invention, wherein opposite ends of the clearance groove are formed in a radius shape.

An eighth aspect of the claimed invention provides a piezoelectric device according to the piezoelectric device of the first aspect of the invention, wherein a buffer portion is formed by metallization in a predetermined thickness, width, and length on the bottom face of the housing recess close to the edge.

A ninth aspect of the claimed invention provides a piezoelectric device according to the piezoelectric device of the first aspect of the invention, wherein a sectional shape of the edge is a corner portion, a C face shape, or a radius shape.

Effects of the Invention

According to the piezoelectric device of the present invention, the angular edge of the clearance groove is formed so as to be positioned below the base of the tuning-fork piezoelectric vibrating element. Consequently, even if a large impact is imparted to the piezoelectric device, a part of the support arm having a large dynamic load of the tuning-fork piezoelectric vibrating element does not collide, thereby enabling to prevent breakage of the support arm. Even if the surface of the base and the edge collide with each other, there is little possibility of breakage of the planar section and corner portion of the base.

BRIEF DESCRIPTION OF THE DRAWINGS

FIG. 6 (*a*) is an enlarged sectional view of the edge having an angular corner portion, FIG. 6 (*b*) an enlarged sectional view of the edge forming a C face at the corner portion, FIG. 6 (*c*) is an enlarged sectional view of the edge forming a radius portion at the corner portion, and FIG. 6 (*d*) is an enlarged sectional view of the edge, with a buffer portion formed by metallization on a bottom face of a housing recess close to the edge.

BEST MODE FOR CARRYING OUT THE INVENTION

First Embodiment

Figure 1:
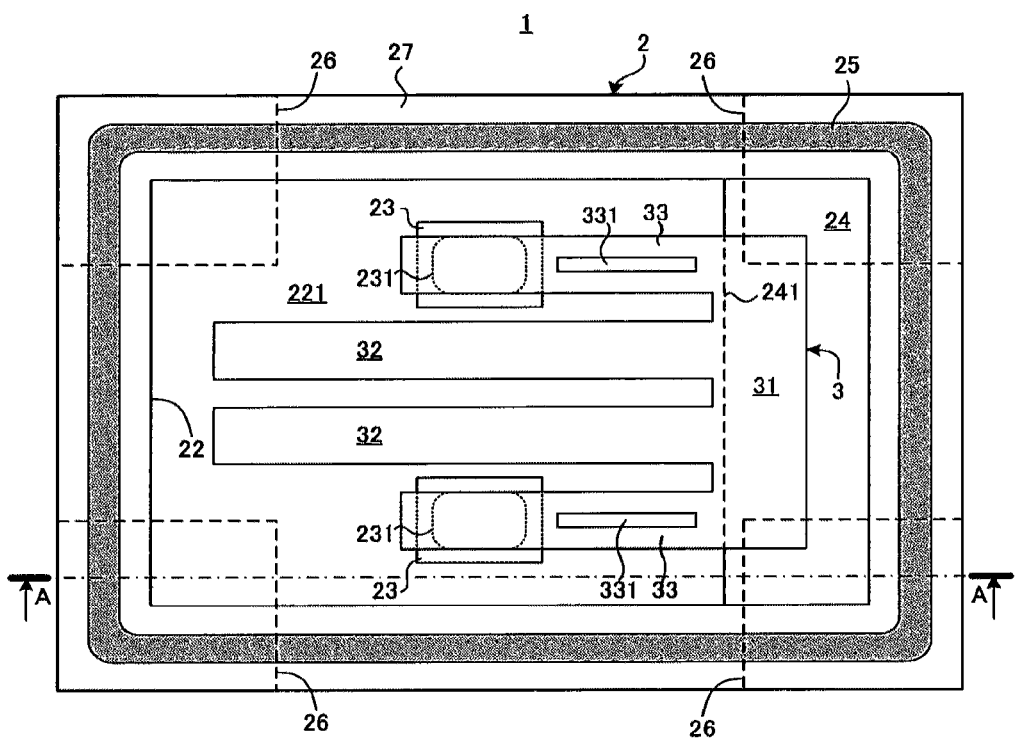
FIG. 1 is a plan view of a piezoelectric device according to a first embodiment of the present invention, as seen with a lid removed.
Figure 2:
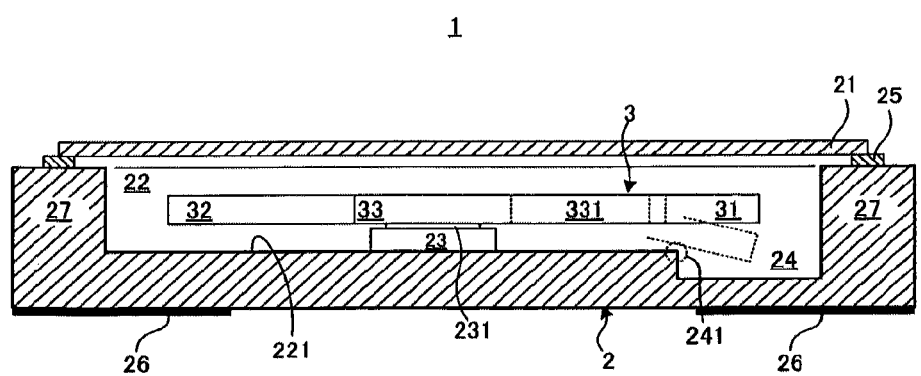
FIG. 2 is a sectional view on arrow A-A of the piezoelectric device according to the first embodiment of the present invention, shown in FIG. 1.
Figure 3:
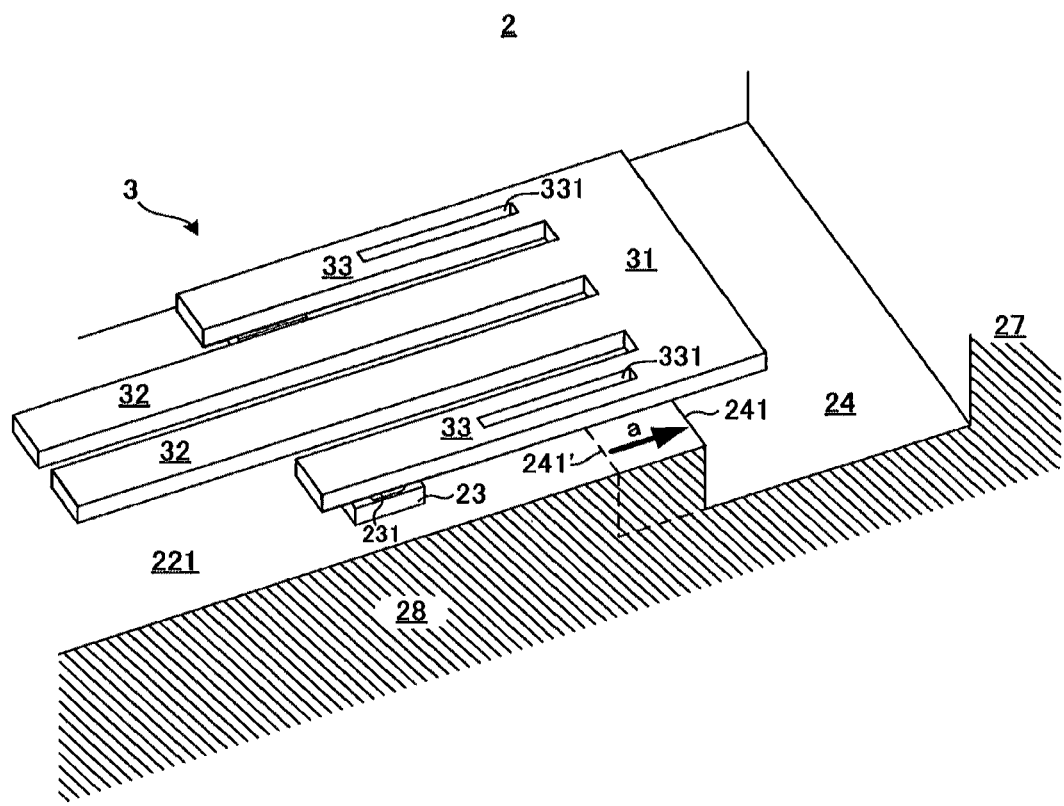
FIG. 3 is a partially cut-away perspective view of the piezoelectric device according to the first embodiment of the present invention.

Hereunder, a first embodiment of the present invention will be explained with reference to FIG. 1. FIG. 1 is a plan view of a piezoelectric device according to a first embodiment of the present invention, when a lid removed. FIG. 2 shows the piezoelectric device according to the first embodiment of the present invention, and is a sectional view on arrow A-A in FIG. 1. FIG. 3 is a partially cut-away perspective view of the piezoelectric device according to the first embodiment of the present invention.

A piezoelectric device 1 according to the present invention comprises a package 2 and a tuning-fork piezoelectric vibrating element 3 housed in the package 2. The package 2 has a bottom wall 28, a side wall 27, and a lid 21 to form a housing recess 22 therebetween. The tuning-fork piezoelectric vibrating element 3 is housed in the housing recess 22.

A metal ring 25 is provided on an upper surface of the side wall 27, and the lid 21 is welded to the ring 25, thereby hermetically sealing the housing recess 22 with respect to the outside of the package 2. Normally, an inside of the housing recess 22 is evacuated, or gas such as nitrogen gas is filled therein to prevent the oscillation frequency of the piezoelectric device 1 from changing due to a change with age or the like.

The tuning-fork piezoelectric vibrating element 3 is made of a piezoelectric material such as crystal, and has a base 31, a pair of vibrating arms 32 positioned parallel to each other and extending from the base 31 at right angles as seen in a plan view, and a pair of support arms 33 extending from the base 31 positioned parallel to each other and in the same direction as the vibrating arms 32, with the pair of vibrating arms 32 therebetween. Moreover, an electrode for forming an electric field is formed on the surface of the vibrating arms 32 as conventionally, so as to be used as a vibrating element.

A pair of supports 23 is formed on a bottom face 221 of the housing recess 22 of the package 2, and ends of the respective support arms 33 of the tuning-fork piezoelectric vibrating element 3 are fixed to upper surfaces of the respective supports 23 by a conductive adhesive 231. A long through hole 331 can be formed in some cases in the support arm 33 along a longitudinal direction thereof, thereby enabling to improve vibration efficiency of the tuning-fork piezoelectric vibrating element 3. However, it is not essential.

On the supports 23, electrodes (not shown) respectively connected to a pair of terminal electrodes 26 formed on a bottom face of the piezoelectric device are formed on upper surfaces of the supports 23. The tuning-fork piezoelectric vibrating element 3 is fixed to the supports 23 by the conductive adhesive 231 and is mechanically supported, and is supplied with a drive voltage for electrically driving the tuning-fork piezoelectric vibrating element 3, through the terminal electrodes 26.

A clearance groove 24 is also formed in a bottom face of the housing recess 22 over the entire width. The clearance groove 24 is formed at a position where there is an edge 241 forming a boundary with the clearance groove 24 below the base 31. A conventional position of an edge 241' (shown by the dotted line) spans an area of the support arm 33. However, it is the most characteristic point of the present invention that the position of the edge 241 is shifted to the position shown by the solid line (that is, a position just below the base 31) as shown by the arrow in FIG. 3.

Because the angular edge 241 does not span the area of the support arm 33, even if a large impact is imparted to the piezoelectric device 1, a part of the support arm 33 of the tuning-fork piezoelectric vibrating element 3 does not collide against the edge 241 of the clearance groove 24. Consequently, the angular edge 241 does not collide against the support arm 33, which is originally subjected to receive a large dynamic load and, in some cases, becomes weaker due to formation of the long through hole 331 in the support arm 33, thereby decreasing the possibility of breakage of the support arm 33.

Even if the edge 241 collides against the base 31, the collision point is on a planar section of the base 31, and hence, the possibility of a crack is extremely small not only in the planar section of the base 31 but also at the corner portion of the base 31.

The piezoelectric device 1 of the present invention can be applied to a type incorporated with an IC for oscillation, more specifically, to a crystal oscillator.

Second Embodiment

Next, a second embodiment of the present invention will be explained with reference to FIG. 4 and FIG. 5.

In a piezoelectric device 1 according to the second embodiment of the present invention, in addition to the clearance groove 24 being formed over the entire width of the bottom face 221 of the package 2 of the piezoelectric device 1 shown in FIG. 1 to FIG. 3 in an area in which the edge 241 forming the boundary with the clearance groove 24 is formed just below the base 31, this is also formed over the entire width of the bottom face 221 in an area below the ends of vibrating arms 32. Moreover, a semicircular R portion as seen in a plan view is formed at the opposite ends of the respective clearance grooves 24, and a buffer portion 221a is formed by metallization in a predetermined thickness, width, and length on the bottom face 221 of the housing recess 22 close to the edges 241. Consequently, in the second embodiment, when a large impact is imparted to the piezoelectric device 1, the positions abutting in turn on the edge 241 of the clearance groove 24 are at first a rear surface of one support arm 33, a rear surface of the base 31, and a rear surface of the other support arm 33.

Figure 4:
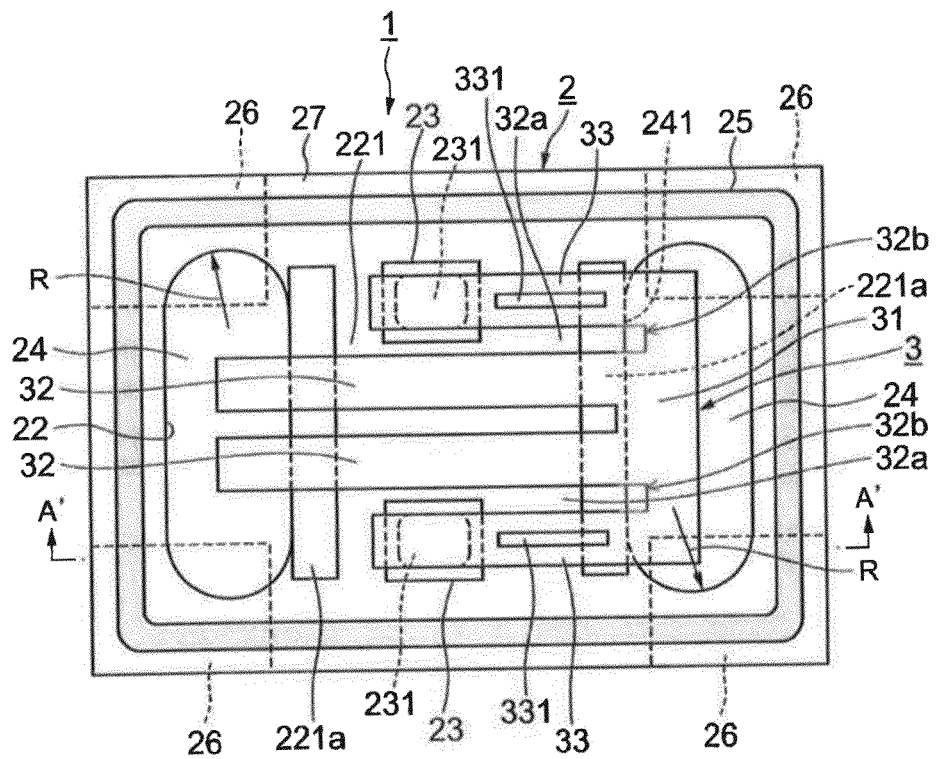
FIG. 4 is a plan view of a piezoelectric device according to a second embodiment of the present invention, as seen with a lid removed.
Figure 5:
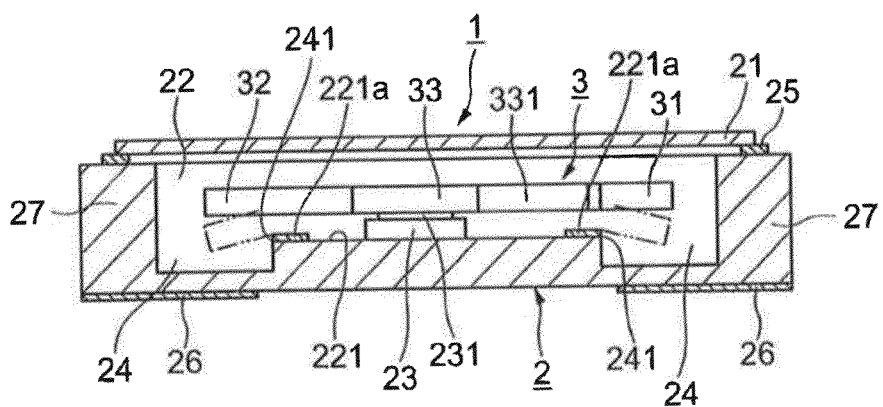
FIG. 5 is a sectional view on arrow A'-A' of the piezoelectric device according to the second embodiment of the present invention, shown in FIG. 4.

Particularly, in the second embodiment, as shown in FIG. 4, because the R portion (semicircular R portion) is respectively formed at the opposite ends of the clearance grooves 24, when the piezoelectric device 1 is subjected to receive a large impact and the piezoelectric device 1 vibrates, the rear surfaces of the support arms 33 abut on the R portion formed at the opposite ends of the clearance grooves 24 to weaken vibration of the body of the tuning-fork piezoelectric vibrating element 3. Consequently, the support arms 33 do not directly collide against the edge 241 of the clearance groove 24. Particularly, the buffering effect on the vibration is doubled by respectively forming a longitudinal slot 32a between the vibrating arm 32 and the support arm 33.

That is to say, when the edge 241 is positioned to the tip end side of the vibrating arm 32 from a crotch portion of the tuning fork, the rear surface of the vibrating arm 32 abuts on the edge 241. However, as shown in FIG. 4, in the second embodiment, the edge 241 is positioned to the base 31 side from the crotch portion of the tuning fork, and an end 32b of the longitudinal slot 32a formed between the support arm 33 and the vibrating arm 32 is positioned to the clearance groove 24 side tip end side of the vibrating arm 32 from the edge 241.

Consequently, a situation is avoided where the edge 241 directly abuts on the vibrating arm 32 which is not very rigid due to formation of the groove in a principal surface or the like, and which has an excitation electrode formed on the principal surface or the like and vibrates with an accurate frequency, and which must not be damaged. According to the configuration, as shown in FIG. 4, when the piezoelectric device 1 is subjected to receive a large impact and vibrates, the piezoelectric device 1 abuts on the edge 241 at three positions, that is, the one support arm 33, the base 31, and the other support arm 33. As a result, the impact force is spread to the three positions, and the buffering effect can be further improved from a case in which the piezoelectric device 1 abuts on one portion of the base 31.

Figure 6:
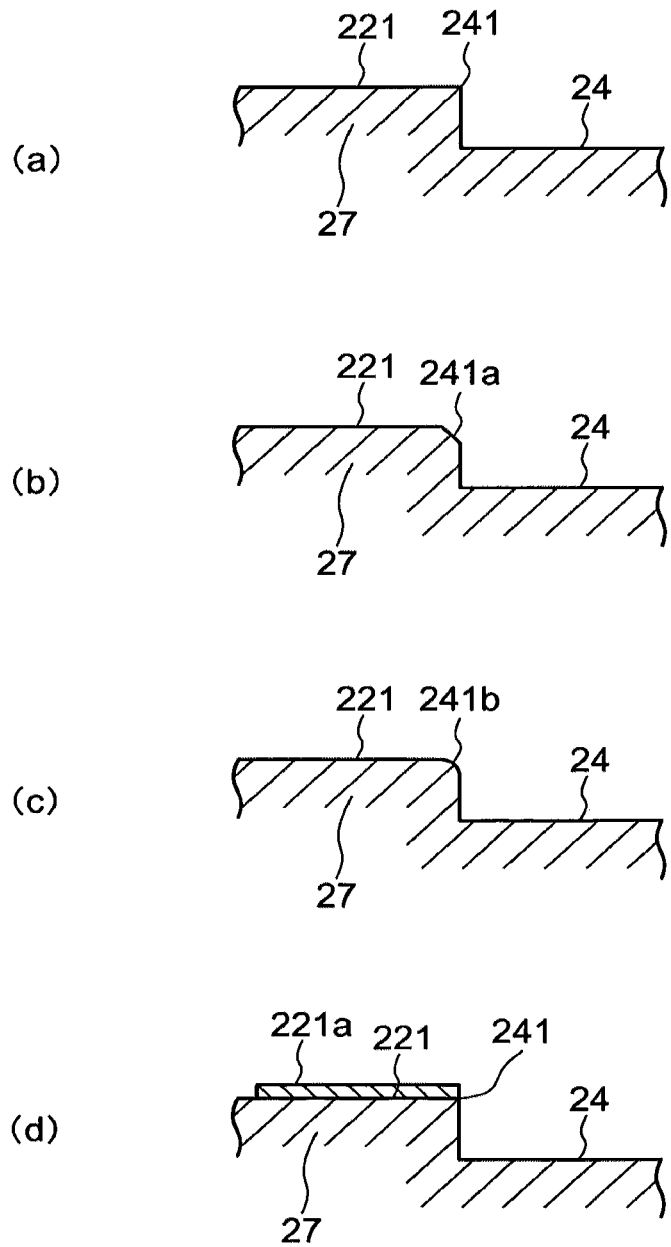
FIG. 6 is a partially enlarged sectional view of an edge of the piezoelectric device shown in FIG. 1 to FIG. 5.

Moreover, in either one of the first embodiment and the second embodiment, as shown in FIG. 6, the edge 241 of the clearance groove 24 formed in the bottom face 221 of the housing recess 22 of the package 2 can be formed in an angular shape as shown in FIG. 6 (a), in a C face shape as shown in FIG. 6 (b), or in a radius face shape as shown in FIG. 6 (c), or the buffer portion 221a can be formed by metallization as shown in FIG. 6 (d) in a predetermined thickness, width, and length on the bottom face 221 close to the edge 241.

What is claimed is:

1. A piezoelectric device comprising:
a tuning-fork piezoelectric vibrating element having: a base; a pair of vibrating arms positioned parallel to each other and extending from said base at right angles as seen in a plan view; and a pair of support arms extending from said base positioned parallel to each other and in the same direction as said vibrating arms,
a package having: a lid; a housing recess sealed by said lid and in which said tuning-fork piezoelectric vibrating element is housed; a pair of supports provided on a bottom face of said housing recess for fixing said tuning-fork piezoelectric vibrating element by said support arms, on opposite sides of said base; and clearance groove formed over the entire width of said bottom face in order to prevent the tuning-fork piezoelectric vibrating element fixed on said supports from colliding against the bottom face of said housing recess, wherein,
the edge of said clearance groove is formed to said base side from a crotch portion of said tuning fork, and an end of a longitudinal slot formed between said support arm and said vibrating arm positioned to said clearance groove side tip end side of said vibrating arm from the edge so that a portion of said base collides therewith, thereby preventing a portion of said support arm from colliding against an edge of said clearance groove when an impact is imparted to said piezoelectric device.

2. A piezoelectric device according to claim 1, wherein a material of said tuning-fork piezoelectric vibrating element is crystal.

3. A piezoelectric device according to claim 2, wherein electrodes respectively connected to a pair of terminal electrodes formed on a bottom face of the piezoelectric device are formed on each upper surface of said supports, and said tuning-fork piezoelectric vibrating element is mechanically supported thereon by a conductive adhesive, and a drive voltage for electrically driving the tuning-fork piezoelectric vibrating element is supplied thereto.

4. A piezoelectric device according to claim 2, wherein a long through hole is formed in said support arm along a longitudinal direction of said support arm.

5. A piezoelectric device according to claim 1, wherein said clearance groove has a rectangular shape as seen in a plan view.

6. A piezoelectric device according to claim 5, wherein electrodes respectively connected to a pair of terminal electrodes formed on a bottom face of the piezoelectric device are formed on each upper surface of said supports, and said tuning-fork piezoelectric vibrating element is mechanically supported thereon by a conductive adhesive, and a drive voltage for electrically driving the tuning-fork piezoelectric vibrating element is supplied thereto.

7. A piezoelectric device according to claim 5, wherein a long through hole is formed in said support arm along a longitudinal direction of said support arm.

8. A piezoelectric device according to claim 1, wherein electrodes respectively connected to a pair of terminal electrodes formed on a bottom face of the piezoelectric device are formed on each upper surface of said supports, and said tuning-fork piezoelectric vibrating element is mechanically supported thereon by a conductive adhesive, and a drive voltage for electrically driving the tuning-fork piezoelectric vibrating element is supplied thereto.

9. A piezoelectric device according to claim 1, wherein a long through hole is formed in said support arm along a longitudinal direction of said support arm.

10. A piezoelectric device according to claim 1, wherein opposite ends of said clearance groove are formed in a radius shape.

11. A piezoelectric device according to claim 1, wherein a buffer portion is formed by metallization in a predetermined thickness, width, and length on said bottom face of said housing recess close to said edge.

12. A piezoelectric device according to claim 1, wherein a sectional shape of said edge is a corner portion, a C face shape, or a radius shape.

* * * * *